US005444396A

United States Patent [19]

Soneda

[11] Patent Number: 5,444,396
[45] Date of Patent: Aug. 22, 1995

[54] LEVEL SHIFTING CIRCUIT

[75] Inventor: Mitsuo Soneda, Kanagawa, Japan

[73] Assignee: Sony Corporation, Japan

[21] Appl. No.: 309,632

[22] Filed: Sep. 21, 1994

[30] Foreign Application Priority Data

Sep. 29, 1993 [JP] Japan ................................ 5-242955

[51] Int. Cl.⁶ ........................................ H03K 19/0175
[52] U.S. Cl. ........................................ 326/81; 326/27; 326/121
[58] Field of Search ............... 326/81, 27, 121

[56] References Cited

U.S. PATENT DOCUMENTS

| 4,506,164 | 3/1985 | Higuchi | 307/264 |
| 4,656,373 | 4/1987 | Plus | 307/475 |
| 4,978,870 | 12/1990 | Chen | 307/475 |
| 5,204,557 | 4/1993 | Nguyen | 307/475 |
| 5,223,751 | 6/1993 | Simmons | 307/475 |

Primary Examiner—Edward P. Westin
Assistant Examiner—Andrew Sanders
Attorney, Agent, or Firm—Ronald P. Kananen

[57] ABSTRACT

A level shifting circuit for converting a lower logic level into a higher logic level is arranged to prevent a large through current from flowing when the level of an input signal varies. A latch circuit for latching an input binary signal comprises first and second transistors to which there are connected in series third and fourth transistors, respectively, for blocking a current during the level shifting period. Fifth and sixth transistors having a small current capacity are connected parallel to the set of first and third transistors and the set of second and fourth transistors, respectively, to quickly respond to a level change. The fifth and sixth transistors may be dispensed with.

3 Claims, 5 Drawing Sheets

LEVEL SHIFTING CIRCUIT

BACKGROUND OF THE INVENTION

The present invention relates to a level shifting circuit for use in connecting LSI (large-scale-integration) circuits having different logic levels.

DESCRIPTION OF THE RELATED ART

LSI circuits have recently been finding lower power requirements. There have been developed LSI circuits having power supply voltages which are progressively reduced from 5V to 3.3V to 2.5V to 1.5V. In view of such lower power requirements, there is a growing demand for level shifting circuits for connecting LSI circuits having different logic levels. For example, a high logic level ranging from 12 to 18 Vpp for use in flash memories has to be converted from a large level difference from a logic level ranging from 1.5V to 3.3V.

One conventional level shifting circuit is shown in FIG. 1 of the accompanying drawings. As shown in FIG. 1, the level shifting circuit has an input terminal 1 is supplied with a 2-level input signal whose level can vary between voltages of 0V and Vcc (e.g., 3V) of a Vcc power supply, and an output terminal 2 for outputting a 2-level output signal whose level can vary between voltages 0 V and Vpp (e.g., 18V) of a Vpp power supply.

The level shifting circuit also includes an inverter 3 for inverting the input signal and applying an inverted input signal to the gate of a transistor N2.

The level shifting circuit also has transistors P1, P1', N1, N1' which jointly make up a latch circuit for introducing the input signal level, and transistors N2, N2' as drive transistors.

The transistor P1 has a terminal (source or drain) connected to the bias power supply Vpp and another terminal connected to a terminal of the transistor N1. Another terminal of the transistor N1 is grounded The transistors P1', N1' are connected in series between the bias power supply Vpp and ground. The transistors P1', N1' are connected to each other through a junction 7 which is connected to the gates of the transistors P1, N1. The transistors P1, N1 are connected to each other through a junction 6 which is connected to the gates of the transistors P1', N1'.

Transistors Q1, Q2 have respective gates connected to the junction 6. The transistor Q1 has a terminal (source or drain) connected to the bias power supply Vpp, and another terminal connected to the output terminal 2. The transistor Q2 has a terminal (source or drain) connected to ground, and another terminal connected to the output terminal 2.

Operation of the level shifting circuit shown in FIG. 1 will be described below with reference to FIG. 2 of the accompanying drawings.

When an input signal of the voltage Vcc is applied to the input terminal 1, the voltage Vcc is applied to the gate of the transistor N2', turning on the transistor N2', and the potential at the junction 7 is substantially at 0 V. Since the potential at the junction 7 is applied to the gates of the transistors P1, N1, these transistors P1, N1 are turned on, and the potential at the junction 6 is kept substantially at the voltage Vpp.

When the level of the input signal falls to 0V at a time t1, the transistor N2' is turned off, and the transistor N2 is turned on. The transistors P1, N1 remains turned on. With the transistor N2 turned on, the potential at the junction 6 is forcibly pulled down to 0V, thereby reducing the current which flows through the transistors P1, N1. Since the potential at the junction 6 is applied to the gates of the transistors P1', N1', these transistors P1', N1' start being rendered conductive, thereby increasing the potential at the junction 7.

When the potential at the junction 6 falls to 0V at a time t2, the transistors P1, N1 are turned off. The transistors P1', N1' are turned on, and the potential at the junction 7 increases to the voltage Vpp.

When the level of the input signal rises to the voltage Vcc at a time t3, the transistor N2' is turned on again, starting to forcibly pull the potential at the junction 7 down to 0V. The current flowing through the transistors P1', N1' is reduced, lowering the potential at the junction 7.

The current flowing through the transistors P1, N1 increases, and so is the potential at the junction 6. At a time t4, the transistors P1', N1' are completely turned off, and the potential at the junction 7 becomes 0V. The transistors P1, N1 are completely turned on, and the potential at the junction 6 reaches the voltage Vpp.

After a time t5, the level shifting circuit repeats the above operation from the time t1 to the time t4. Therefore, when the level of the input signal varies from 0V to the voltage Vcc, the potential at the junction 6 varies from 0V to the voltage Vpp, turning on and off the transistors Q1, Q2. An output signal produced at the output terminal 2 now varies between 0V and the voltage Vpp.

Since the transistors N2, N2' have a large driving capability, their node capacity is large. In order to maintain a charging speed, the channel width of the transistors P1, P1' is required to be increased to a certain extent.

When the level of the input signal varies from the voltage Vcc to 0V, for example, the potential at a point 5 varies from 0V to the voltage Vcc, turning on the transistor N2 which pulls down the potential at the junction 6. Because the potential in the vicinity of 0V is applied to the gate of the transistor P1 at this time, the transistor P1 is turned on, and a large through current flows from the power supply Vpp to the transistor P1 to the transistor N2 to ground.

On account of the current flowing through the transistor P1, the time required for the potential at the junction 6 to fall is long as indicated by the period from the time t1 to the time t2 in FIG. 2. During this potential fall time, the level shifting circuit shown in FIG. 1 is in a transient state. In this transient state, the large through current flows through the transistors P1, N2, a current flows through the transistors P1, N1, and a current flows through the transistors P1', N1'. Because of these through currents, the level shifting circuit consumes a large amount of electric energy.

OBJECTS AND SUMMARY OF THE INVENTION

It is therefore an object of the present invention to provide a level shifting circuit which is free of through currents during a level shifting period, and has a low power requirement.

According to the present invention, there is provided a level shifting circuit comprising a power supply, a first P-type transistor and a first N-type transistor connected in series between the power supply and ground, a second P-type transistor and a second N-type transistor connected in series between the power supply and ground, a connecting line connecting a first junction between the first P-type transistor and the first N-type transistor to a gate of the second P-type transistor and a gate of the second N-type transistor, a connecting line connecting a second junction between the second P-type transistor and the second N-type transistor to a gate of the first P-type transistor and a gate of the first N-type transistor, an input terminal, a third transistor connected between the first junction and ground and having a gate connected to the input terminal, an inverter connected to the input terminal, a fourth transistor connected between the second junction and ground and having a gate connected to an output terminal of the inverter, an output terminal connected to the second junction, fifth and sixth transistors connected in series with the first and second P-type transistors, respectively, for preventing a relatively large through current from flowing therethrough when the level of an input signal varies, and seventh and eighth transistors having a relatively small drive capability which are connected in parallel respectively to a series-connected circuit of the first P-type transistor and the fifth transistor and a series-connected circuit of the second P-type transistor and the sixth transistor.

Preferably, resistors should be connected in series with the seventh and eighth transistors, respectively, or each of the seventh and eighth transistors should have a resistance.

Preferably, seventh and eighth transistors should be series-connected PMOS transistors, or be dispensed with.

In the level shifting circuit according to the present invention, the fifth and sixth transistors are connected in series with the first and second P-type transistors, respectively, for preventing a relatively large through current from flowing therethrough during a level shifting period; therefore, no large current flows when the logic level of an input signal varies to change on- and off-states of the first and second P-type transistors. The level shifting circuit is thus of a low power requirement.

When the input signal varies in level, the seventh and eighth transistors, which are connected in parallel respectively to the series-connected circuit of the first P-type transistor and the fifth transistor and the series-connected circuit of the second P-type transistor and the sixth transistor, are turned on. Therefore, the potential at the first or second junction varies from a power supply voltage to 0V in a short period of time.

Since the series-connected circuit of the first P-type transistor and the fifth transistor and the series-connected circuit of the second P-type transistor and the sixth transistor have a large current drive capability, when both of the first P-type transistor and the fifth transistor or the second P-type transistor and the sixth transistor are turned on, the potential at the first or second junction can be charged up from 0V to the power supply voltage in a short period of time.

DETAILED DESCRIPTION OF THE PREFERRED EMBODIMENTS

A level shifting circuit according to a first embodiment of the present invention will be described below with reference to FIGS. 3 and 4.

Figure 1:
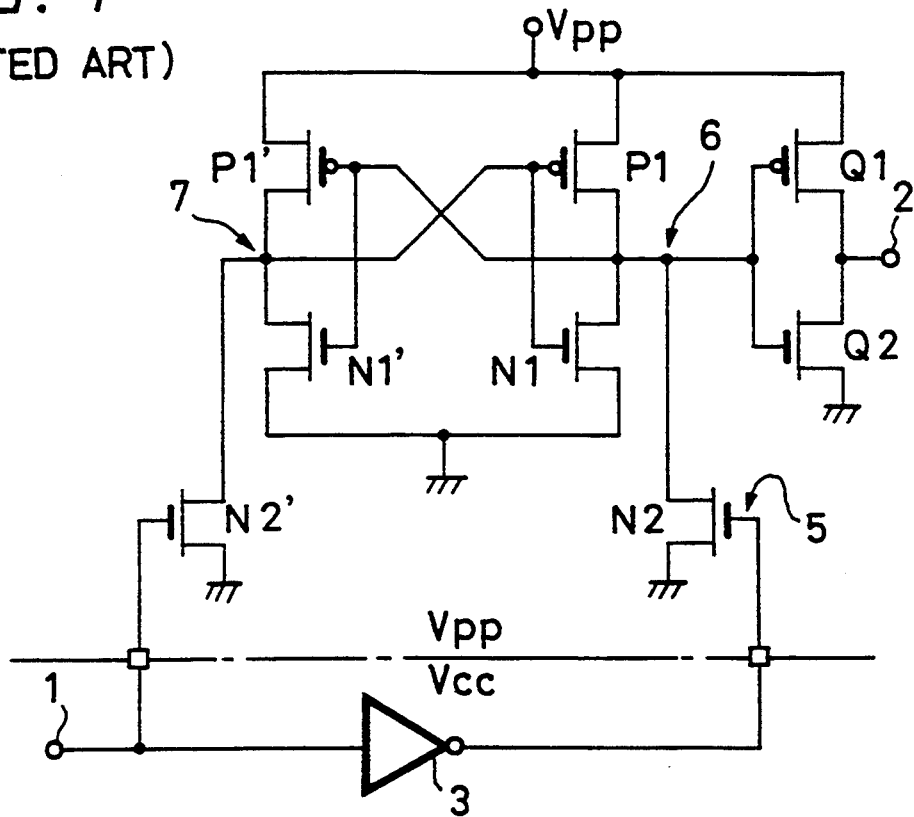
FIG. 1 is a circuit diagram of a level shifting circuit of the related art.
Figure 2:
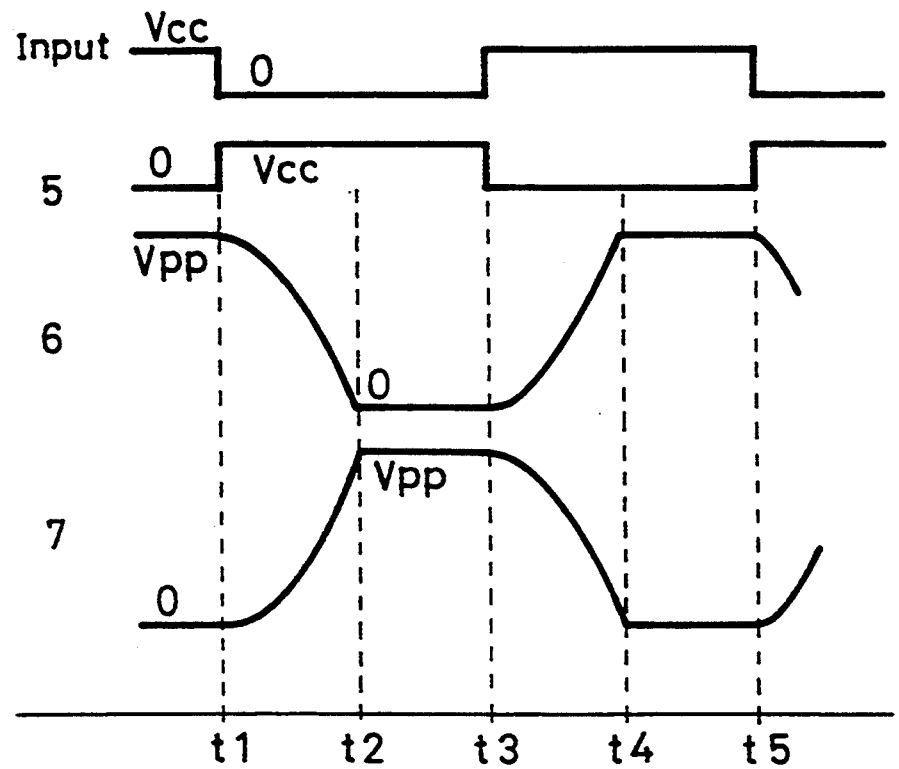
FIG. 2 is a timing chart showing the manner in which the level shifting circuit shown in FIG. 1 operates.
Figure 3:
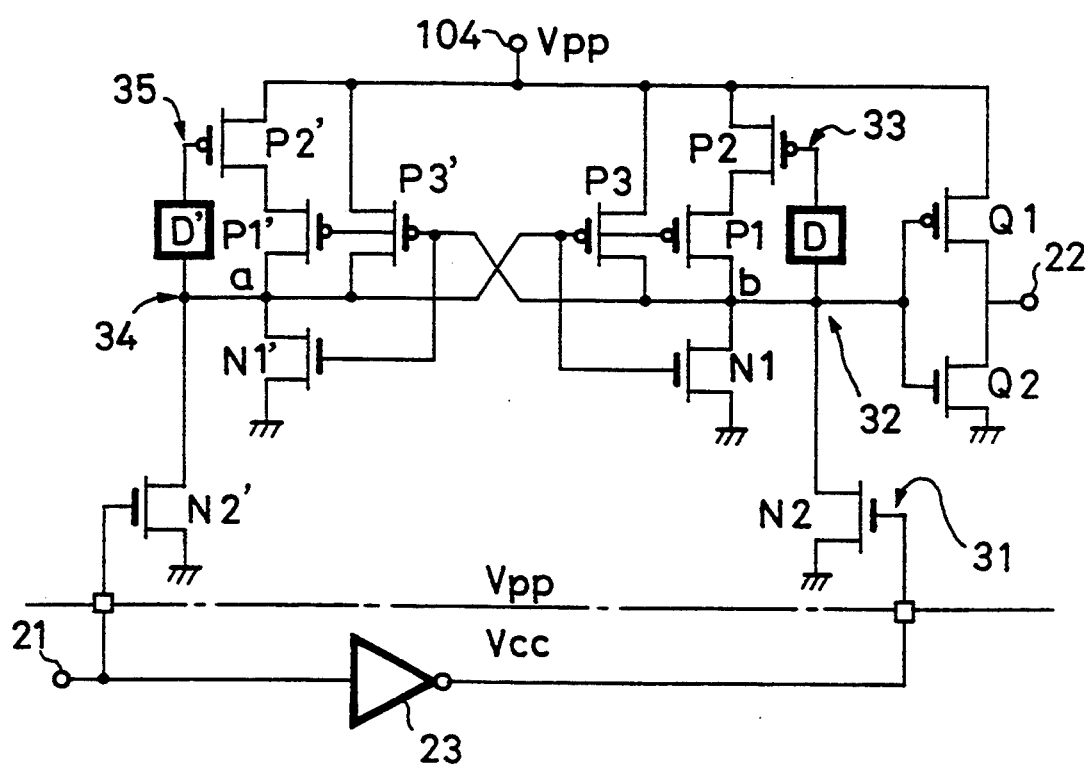
FIG. 3 is a circuit diagram of a level shifting circuit according to a first embodiment of the present invention.
Figure 4:
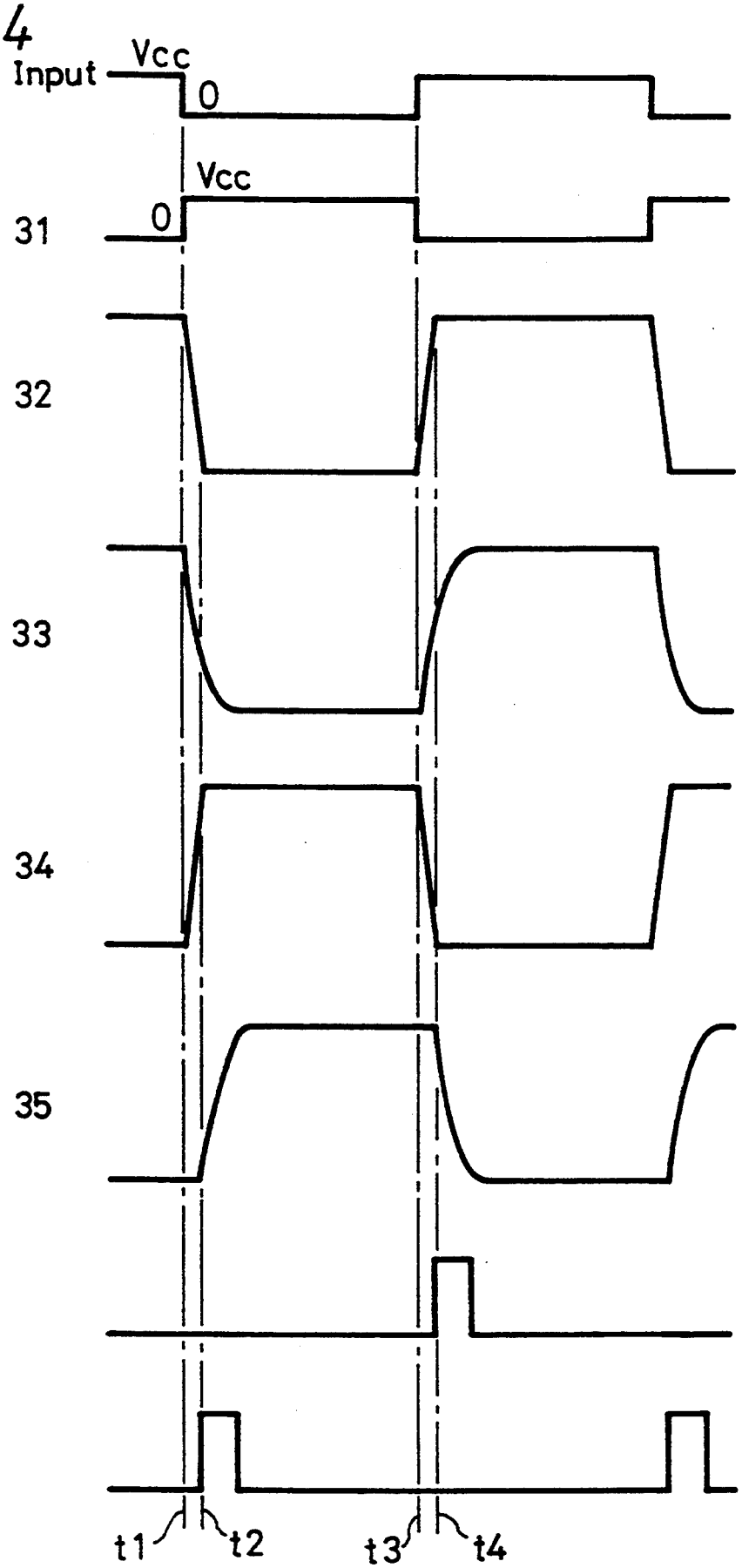
FIG. 4 is a timing chart showing the manner in which the level shifting circuit shown in FIG. 3 operates.

The level shifting circuit shown in FIG. 3 has transistors P1, N1, N2, P1', N1', N2', Q1, Q2 which are identical to those shown in FIG. 1. The level shifting circuit shown in FIG. 3 has an input terminal 21 which is supplied with a 2-level input signal can vary between voltages of 0V and Vcc (e.g., 3V) of a Vcc power supply, and an output terminal 22 for outputting a 2-level output signal whose level can vary between voltages 0V and Vpp (e.g., 18V) of a Vpp power supply. The level shifting circuit also includes an inverter 23 for inverting the input signal and applying an inverted input signal to the gate of the transistor N2.

The level shifting circuit additionally includes transistors P3, P3', a transistor P2 and a delay element D connected to the gate of the transistor P2, a transistor P2' and a delay element D' connected to the gate of the transistor P2'. The level shifting circuit shown in FIG. 3 is implemented as a semiconductor integrated circuit.

Each of the delay elements D, D' may comprise a resistor, an inverter, a P-type MOS transistor, or the like. The transistors P3, P3' have a ratio W/L (W represents the channel width and L the channel length) smaller than the ratio W/L of the other transistors P1, P2, P1', P2'.

Since the gate capacity of each of the transistors P3, P3' is relatively small, they tend to be saturated in a short period of time and to drop the voltage Vpp to 0V in a short period of time.

Operation of the level shifting circuit shown in FIG. 3 will be described below with reference to FIG. 4. When the level of the input signal supplied to the input terminal 21 varies from the voltage Vcc to 0V at a time t1, the transistor N2' is turned off. The transistor N2 is turned on as the potential at a point 31 varies from 0V to the voltage Vcc.

With the transistor N2 turned on, the potential at a point 32 tends to fall from the voltage Vpp to 0V. Since the potential at a point 34 is still 0V at this time, the gate voltage of the transistor P1 is 0V, and the transistor P1 is turned on. As the gate potential of the transistor P2 still remains at the voltage Vpp, the transistor P2 is turned off.

Therefore, no current flows through the series-connected circuit of the transistors P1, P2 which have a large current drive capability. At this time, a current supplied from the power supply Vpp to the point 32 flows through the transistor P3 which has a small drive capability, so that the potential at the point 32 falls from the voltage Vpp to 0V in a short period of time.

When the potential at the point 32 reaches 0V, the transistor P1' is turned on. At this time, because the gate potential of the transistor P2' is still 0V due to the delay element D', the transistor P2' remains turned on. Therefore, the point 34 is charged up from 0V to the voltage Vpp in a short period of time by the series-connected circuit of the transistors P1', P2' which have a large current drive capability.

After the point 34 has been charged up to the voltage Vpp, the potential at a point 35 also reaches the voltage Vpp through the delay element D', applying the voltage Vpp to the gate of the transistor P2'. The transistor P2' is turned off, eliminating the current flowing through the series-connected circuit of the transistors P2',P1'.

The transistor P3' is turned on at this time because the potential of 0V at the point 32 is applied to the gate thereof. Thus, the potential at the point 34 is kept at the voltage Vpp. The transistor P3' operates to stable latching action, and has a small W/L ratio for preventing leakage current, noise, soft error of the MOS transistors.

When the input signal level varies from 0V to the voltage Vcc at a time t3, the transistor N2' is turned on, tending to forcibly pulling the potential at the point 34 to 0V. At this time, the potential at the point 31 is 0V, turning off the transistor N2.

However, the potential at the point 32 is still 0V and hence the gate voltage of the transistor P1' is 0V, with the transistor P1' being turned on. The transistor P2' is turned off as the gate potential thereof remains at the voltage Vpp.

Therefore, no current flows through the series-connected circuit of the transistors P1', P2' which have a large current drive capability. Since the transistor P3' is turned on, a current flows from the power supply Vpp to the point 34. Inasmuch as the transistor P3' has a small drive capability, the potential at the point 34 falls from the voltage Vpp to 0V in a short period of time.

When the potential at the point 34 reaches 0V, the transistor P1 is turned on. At this time, because the gate potential of the transistor P2 is still 0V due to the delay element D, the transistor P2 remains turned on. Therefore, the point 32 is charged up from 0V to the voltage Vpp in a short period of time by the series-connected circuit of the transistors P1, P2 which have a large current drive capability.

After the point 32 has been charged up to the voltage Vpp, the potential at a point 33 also reaches the voltage Vpp through the delay element D, applying the voltage Vpp to the gate of the transistor P2. The transistor P2 is turned off, eliminating the current flowing through the series-connected circuit of the transistors P2, P1. At this time, the transistor P3 is turned on as the potential of 0V at the point 34 is applied to the gate thereof, and the potential at the point 34 is maintained at the voltage Vpp.

Therefore, when a binary signal which varies between 0V and the voltage Vcc is applied to the input terminal 21, a binary signal which varies between 0V and the voltage Vpp appears at the point 32. Since this binary signal is applied to the gates of the transistors Q1, Q2, a binary signal which varies between 0V and the voltage Vpp appears at the output terminal 22.

In the level shifting circuit shown in FIG. 1, when the potential at the junction 6 falls from the voltage Vpp to 0V, an extracted current flows through the transistor N2 and an injected current flows through the PMOS transistor P1, resulting in a large through current, and the potential fall time poses a problem as a certain period of time is required for the through current to flow. In the level shifting circuit according to the present invention, however, when the potential at the point 32 falls from the voltage Vpp to 0V, no current flows through the series-connected circuit of the transistors P1, P2, but a current flows only through the transistor P3 having a small drive capability. Therefore, the level shifting circuit according to the present invention is of a low power requirement and operates at a high speed.

Figure 5:
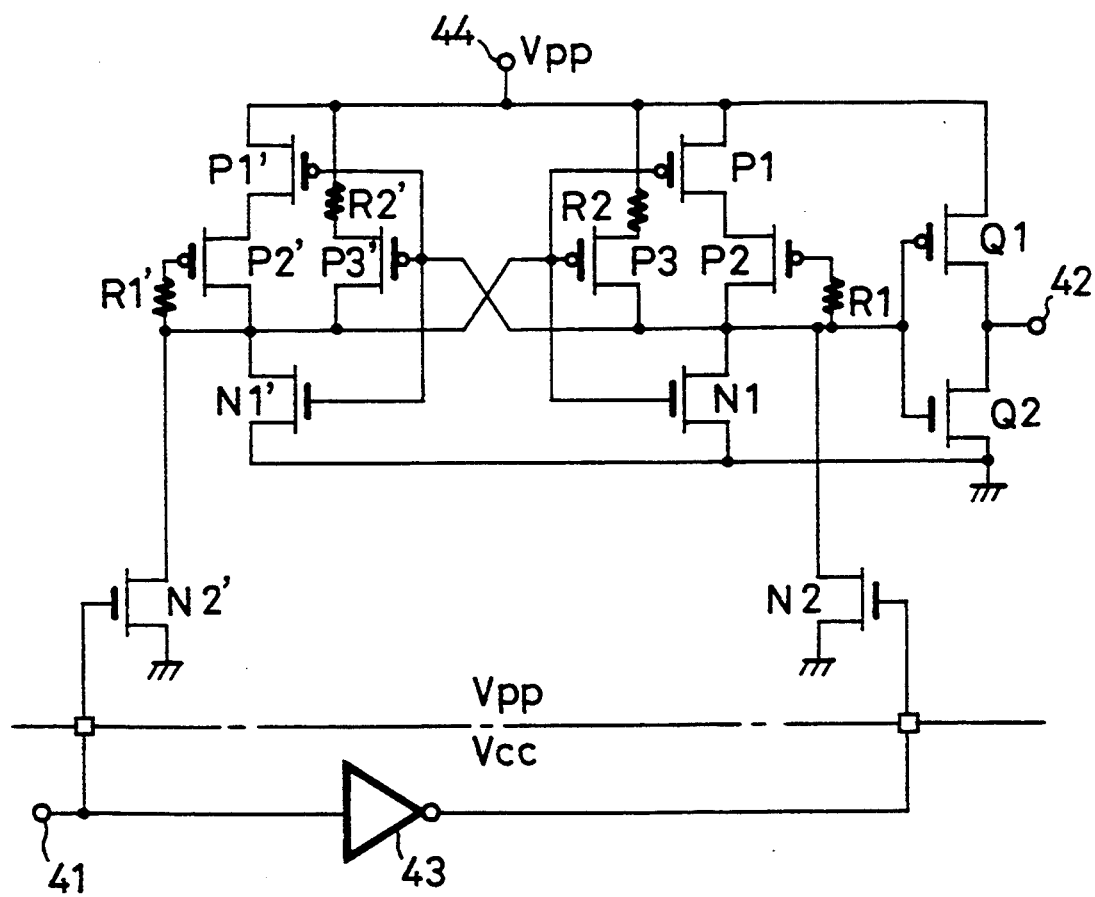
FIG. 5 is a circuit diagram of a level shifting circuit according to a second embodiment of the present invention.

FIG. 5 shows a level shifting circuit according to a second embodiment of the present invention. The level shifting circuit according to the second embodiment is similar to the level shifting circuit according to the first embodiment except that the delay elements D, D' are replaced with resistors R1, R1' respectively, and the transistors P3, P3' are replaced with a set of a resistor R2 and a transistor P3 and a set of a resistor R2' and a transistor R3', respectively. The transistors P3, P3' may have a resistance. The level shifting circuit according to the second embodiment operates essentially in the same manner as the level shifting circuit according to the first embodiment.

A comparison between the level shifting circuits shown in FIGS. 3 and 5 indicates that the transistors P1, P2 and the transistors P1', P2' are switched around. Since the transistors P1, P2 and the transistors P1', P2' may be switched around, they may be positioned in a layout suitable for a circuit pattern employed when the level shifting circuit is fabricated in a semiconductor integrated configuration.

Since the current drive capability of the transistors P3, P3' may be of such a level as to suppress noise and leakage current, they may be fabricated as PMOS TFTs (thin-film transistors) if the level shifting circuit is produced according to a TFT process.

A level shifting circuit according to a third embodiment of the present invention will be described below with reference to FIG. 6.

Figure 6:
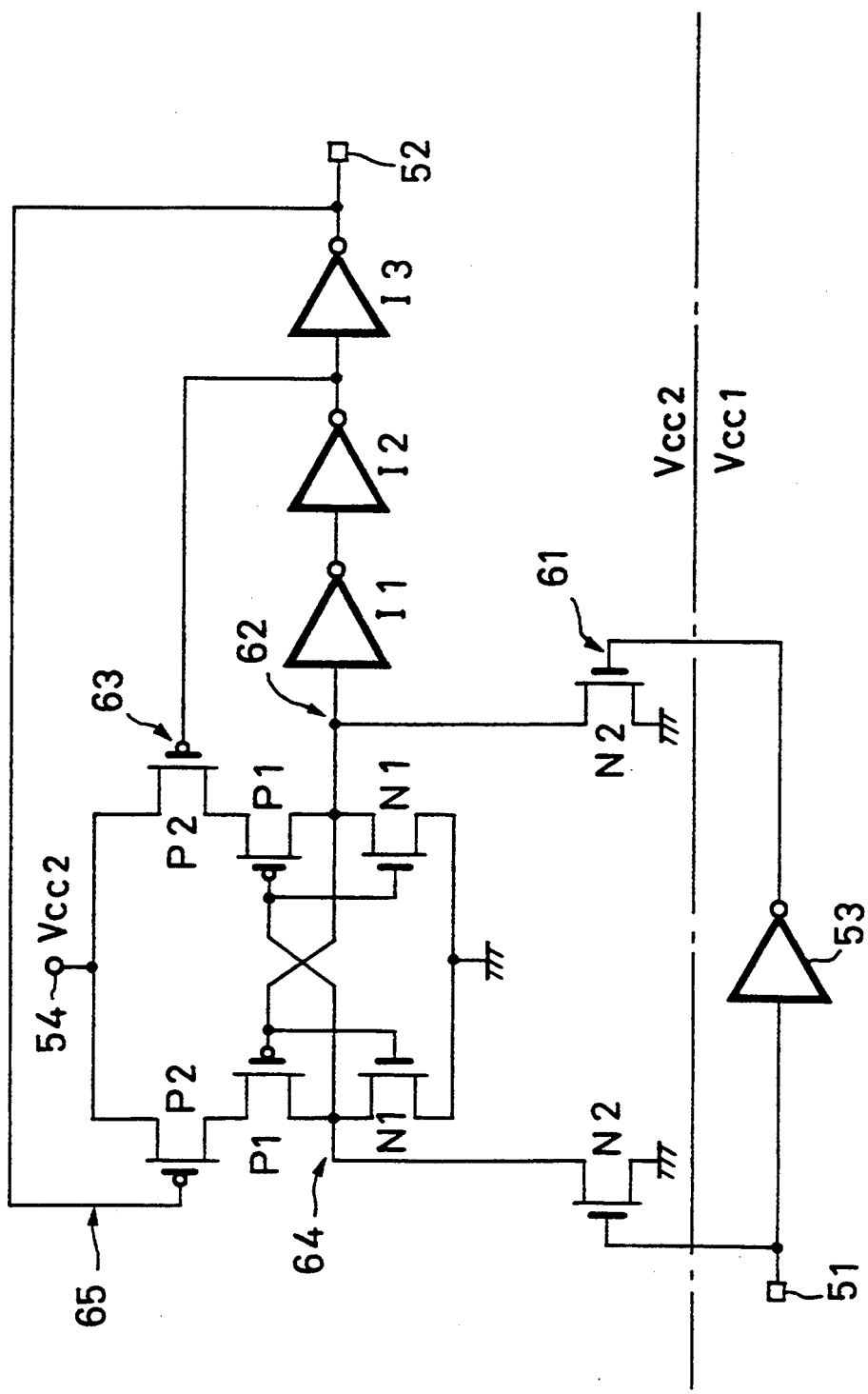
FIG. 6 is a circuit diagram of a level shifting circuit according to a third embodiment of the present invention.

The level shifting circuit shown in FIG. 6 has transistors P1, P2, N1, N2, P1', P2', N1', N2' which are identical to those shown in FIG. 3. The level shifting circuit shown in FIG. 6 has an input terminal 51, an output terminal 52, and an inverter 53, which are similar to the corresponding elements shown in FIG. 3.

The level shifting circuit shown in FIG. 6 differs from the level shifting circuit shown in FIG. 3 in that the transistors P3, P3' shown in FIG. 3 are dispensed with, the potential at a point 62 is transmitted through a series-connected circuit of inverters $I_1$, $I_2$, $I_3$ to the output terminal 52, and the delay elements D, D' shown in FIG. 3 are replaced with outputs from the inverters $I_2$, $I_3$, respectively.

A level shifting circuit for converting a 1V logic into a 3V logic may generally employ a 3V logic. Therefore, the delay elements D, D' may be replaced with outputs from a next-stage logic.

With the above arrangement, the level shifting circuit according to the present invention is of a low power requirement because it is free of a large through current during a level shifting period.

In a flash memory, the program voltage is charged up in the chip to generate a voltage Vpp of about 12 to 20 V). Therefore, the level shifting circuit offers a large advantage in view of the efficiency of a pump.

Inasmuch as the level shifting circuit is latched only by charging or discharging currents of transistors, the level shifting circuit can operate at a high speed.

As the driving from a power supply Vcc1 at the input terminal is not caused by a ratio circuit, the level shifting circuit can operated insofar as Vcc>Vth, i.e., the bias voltage Vcc of the power supply Vcc1 is greater than a threshold Vth. Therefore, the level shifting circuit can shift a level from a logic level at which CMOS transistors operate.

The level shifting circuit according to the present invention is highly advantageous for use with system-on-chips which include circuit blocks with multiple power supplies.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A level shifting circuit comprising:
   a power supply;
   a first P-type transistor and a first N-type transistor connected in series between said power supply and ground;
   a second P-type transistor and a second N-type transistor connected in series between said power supply and ground;
   a connecting line connecting a first junction between said first P-type transistor and said first N-type transistor to a gate of said second P-type transistor and a gate of said second N-type transistor;;
   a connecting line connecting a second junction between said second P-type transistor and said second N-type transistor to a gate of said first P-type transistor and a gate of said first N-type transistor;;
   an input terminal;
   a third transistor connected between said first junction and ground and having a gate connected to said input terminal;
   an inverter connected to said input terminal;
   a fourth transistor connected between said second junction and ground and having a gate connected to an output terminal of said inverter;
   an output terminal connected to said second junction;
   fifth and sixth transistors connected in series with said first and second P-type transistors, respectively, for preventing a relatively large through current from flowing therethrough when the level of an input signal varies; and
   seventh and eighth transistors which are connected in parallel respectively to a series-connected circuit of said first P-type transistor and said fifth transistor and a series-connected circuit of said second P-type transistor and said sixth transistor.

2. A level shifting circuit according to claim 1, wherein each of said seventh and eighth transistors has a resistance.

3. A level shifting circuit comprising:
   a power supply;
   a first P-type transistor and a first N-type transistor connected in series between said power supply and ground;
   a second P-type transistor and a second N-type transistor connected in series between said power supply and ground;
   a connecting line connecting a first junction between said first P-type transistor and said first N-type transistor to a gate of said second P-type transistor and a gate of said second N-type transistor;
   a connecting line connecting a second junction between said second P-type transistor and said second N-type transistor to a gate of said first P-type transistor and a gate of said first N-type transistor;
   an input terminal;
   a third transistor connected between said first junction and ground and having a gate connected to said input terminal;
   an inverter connected to said input terminal;
   a fourth transistor connected between said second junction and ground and having a gate connected to an output terminal of said inverter;
   an output terminal connected to said second junction; and
   fifth and sixth transistors connected in series with said first and second P-type transistors, respectively, for preventing a relatively large through current from flowing therethrough when the level of an input signal varies.

* * * * *